(12) United States Patent
Sakurai

(10) Patent No.: US 10,809,615 B2
(45) Date of Patent: Oct. 20, 2020

(54) PATTERN FORMING METHOD, MASTER TEMPLATE, AND METHOD OF MANUFACTURING TEMPLATE

(71) Applicant: Toshiba Memory Corporation, Tokyo (JP)

(72) Inventor: Noriko Sakurai, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/287,772

(22) Filed: Feb. 27, 2019

(65) Prior Publication Data

US 2020/0089105 A1 Mar. 19, 2020

(30) Foreign Application Priority Data

Sep. 14, 2018 (JP) .................. 2018-172565

(51) Int. Cl.
*H01L 21/027* (2006.01)
*G03F 7/00* (2006.01)
*H01L 21/311* (2006.01)

(52) U.S. Cl.
CPC ........ *G03F 7/0002* (2013.01); *H01L 21/0271* (2013.01); *H01L 21/31127* (2013.01); *H01L 21/31144* (2013.01)

(58) Field of Classification Search
CPC ............... G03F 7/0002; H01L 21/0271; H01L 21/0337; H01L 21/32139; H01L 21/31144; H01L 21/31127; H01L 21/312

USPC ...... 216/41, 47, 48; 438/706, 710, 717, 719, 438/723, 736

See application file for complete search history.

(56) References Cited

U.S. PATENT DOCUMENTS

| | | | |
|---|---|---|---|
| 8,222,150 B2 | 7/2012 | Hashimoto | |
| 8,336,005 B2 | 12/2012 | Taguchi et al. | |
| 8,618,679 B2 * | 12/2013 | Sim | H01L 21/0337 257/773 |
| 9,837,273 B2 * | 12/2017 | Lee | H01L 21/0337 |
| 9,911,701 B2 * | 3/2018 | Fujiwara | H01L 21/0274 |
| 2013/0052583 A1 * | 2/2013 | Keszler | B82Y 10/00 430/270.1 |

(Continued)

FOREIGN PATENT DOCUMENTS

| | | |
|---|---|---|
| JP | 2010239009 A | 10/2012 |
| JP | 2012204453 A | 10/2012 |

(Continued)

*Primary Examiner* — Lan Vinh
(74) *Attorney, Agent, or Firm* — Kim & Stewart LLP

(57) ABSTRACT

A pattern forming method comprises forming a line pattern in a first film. The line pattern includes a first pattern part including feature portions at a first dimension and a second pattern part adjacent to the first pattern part and including feature portions at a second dimension smaller than the first dimension. A second film is formed on the substrate conformally over the first film. The second film is etched to expose a top surface of the first pattern part and remove the second pattern part. The remaining first film is then removed, leaving portions of the second film that were formed on sidewalls of the first pattern part. The substrate is then processed by using those portions of the second film left after the removal of the first film as a mask.

18 Claims, 12 Drawing Sheets

(56) References Cited

U.S. PATENT DOCUMENTS

2015/0054176 A1* 2/2015 Sim .................. H01L 27/11531
257/775

FOREIGN PATENT DOCUMENTS

| JP | 5450275 B2 | 3/2014 |
| JP | 6167609 B2 | 7/2017 |

* cited by examiner

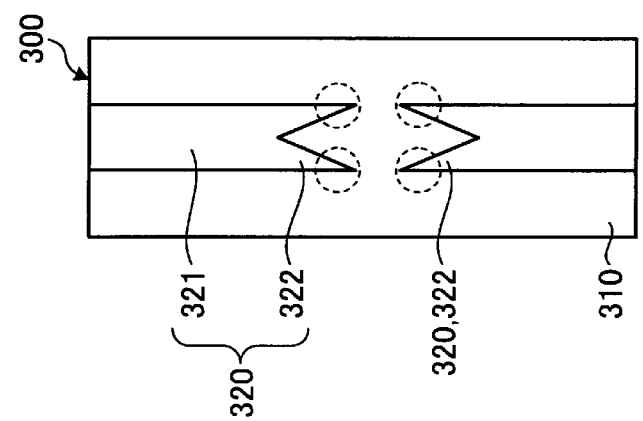
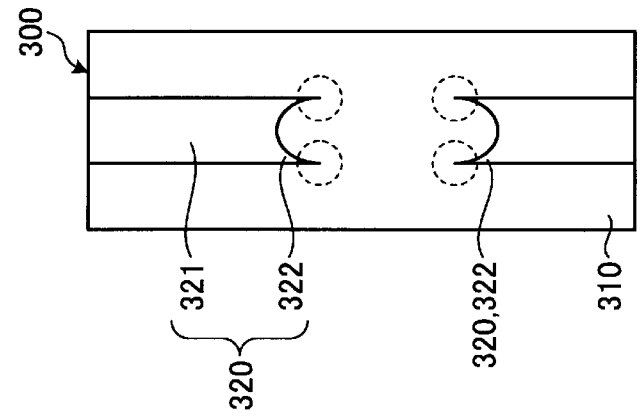
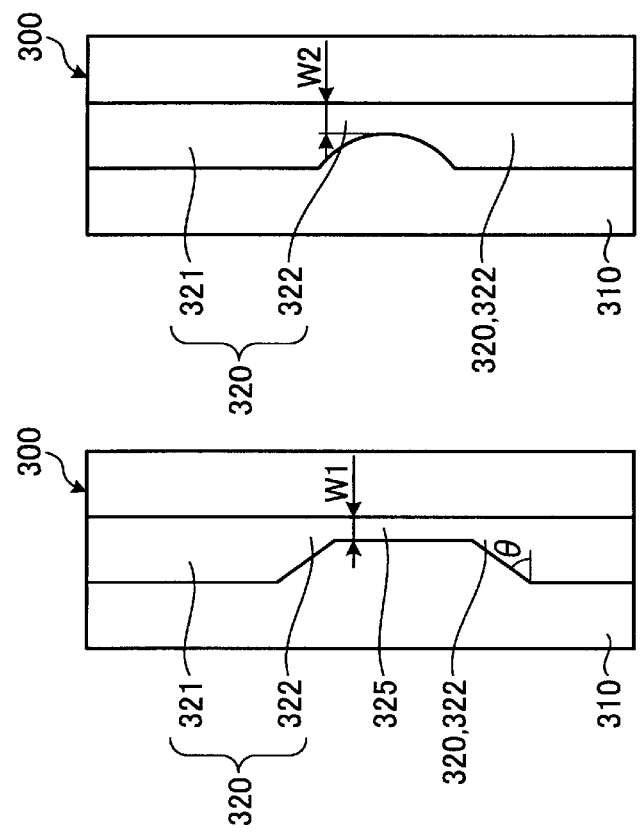

PATTERN FORMING METHOD, MASTER TEMPLATE, AND METHOD OF MANUFACTURING TEMPLATE

CROSS-REFERENCE TO RELATED APPLICATION

This application is based upon and claims the benefit of priority from Japanese Patent Application No. 2018-172565, filed Sep. 14, 2018, the entire contents of which are incorporated herein by reference.

FIELD

Embodiments described herein relate generally to a pattern forming method, a master template, and a method of manufacturing a template.

BACKGROUND

A technique of manufacturing a template by a sidewall transferring process (pattern doubling) is known. The template can be used in an imprinting method.

In forming a pattern by the sidewall transferring process, linear adjacent patterns are connected to each other at their ends and forma loop structure. According to the related art, the loop structure is cut after the pattern of the template, which has the loop structure, is transferred to a wafer.

DESCRIPTION OF THE DRAWINGS

FIGS. 4A to 4H illustrate examples of drawing data.

DETAILED DESCRIPTION

Example embodiments describe a pattern forming method that uses a sidewall transferring process (pattern doubling technique) that dispenses with processing necessary for cutting loops resulting from the pattern forming method on a wafer or a template.

In general, according to one embodiment, a pattern forming method comprises forming a line pattern with a first film on a substrate. The line pattern includes a first pattern part including feature portions at a first dimension and a second pattern part adjacent to the first pattern part including feature portions at a second dimension smaller than the first dimension of the first pattern part. A second film is formed on the substrate conformally over the first film. The second film is then etched to expose a top surface of the first pattern part of the first film and remove the second pattern part of the first film. The first film is then removed leaving portions of the second film that were formed on sidewalls of the first pattern part. The substrate is then processed (e.g., etched) using the portions of the second film left after the removing of the first film as a mask.

The following example embodiments describe details of a pattern forming method, a master template, and a method of manufacturing a template with reference to the attached drawings. It should be noted that these example embodiments are not intended to limit the present disclosure. In addition, cross-sectional and other views of templates used in the following embodiments are schematically described, and dimensional relationships such as a relationship between thickness and width of a layer and a ratio of thickness between layers may be different from those of an actual product.

First Embodiment

FIGS. 1A to 1H are top views schematically illustrating an example of a procedure of a pattern forming method according to a first embodiment. FIGS. 2A and 2B illustrate an example of a resist pattern according to the first embodiment. FIG. 2A is a top view, and FIG. 2B is an oblique view. FIGS. 3A to 3H are cross-sectional views schematically illustrating the example of the procedure of the pattern forming method according to the first embodiment. FIGS. 3A to 3H illustrate a cross section CS-A, a cross section CS-B, and a cross section CS-C of a resist core material illustrated in FIG. 2B. FIGS. 1A to 1H illustrate only a region that is formed on a template substrate by using a sidewall transferring process.

Figure 1A:
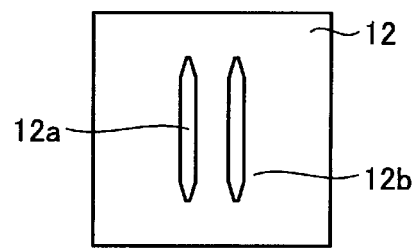
FIGS. 1A to 1H are top views schematically illustrating a first half (FIGS. 1A to 1D) and a second half (FIGS. 1E to 1H) of a pattern forming method according to a first embodiment.
Figure 2A:
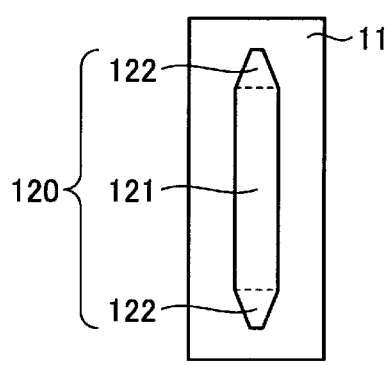
FIGS. 2A and 2B illustrate an example of a resist pattern according to the first embodiment.
Figure 2B:
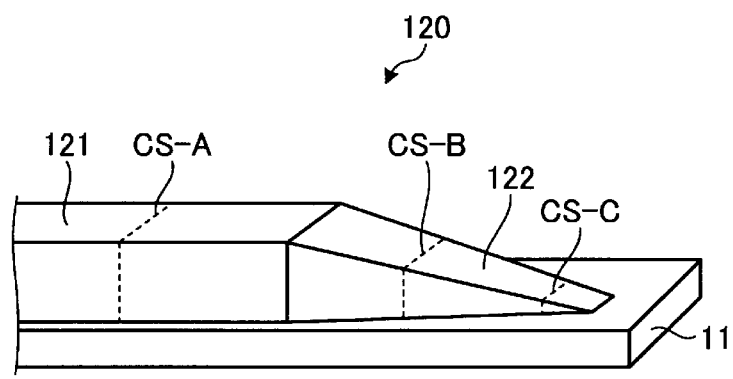
Figure 3A:
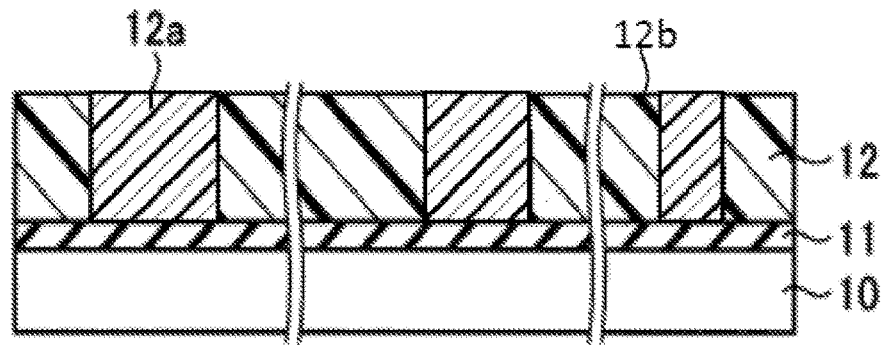
FIGS. 3A to 3H are cross-sectional views schematically illustrating the first half (FIGS. 3A to 3D) and the second half (FIGS. 3E to 3H) of a pattern forming method according to the first embodiment.

First, as illustrated in FIGS. 1A and 3A, a hard mask film 11 is deposited on a template substrate 10, and a resist 12 is applied onto the hard mask film 11. The template substrate 10 is, for example, a rectangular quartz substrate. The hard mask film 11 is, for example, a chromium film. The template substrate 10 and the hard mask film 11 are an example of an object to be processed. Thereafter, a pattern is drawn on the resist 12 by electron beam lithography. This results in formation of a drawn region 12a and an undrawn region 12b in the resist 12.

FIG. 1A illustrates an example of forming drawn regions 12a that constitutes a line-and-space pattern with multiple line patterns arranged in parallel. The drawn region 12a is drawn such that each end part of the line pattern will be narrow. In addition to the linear patterns that are arranged in parallel, the line-and-space pattern may include a lead wiring pattern, a lead-out wiring pattern, and a U-shaped wiring pattern that are arranged so as to cross each other in their extending directions. Moreover, parallel line patterns that are connected by another pattern may also be considered as constituting a line pattern on the condition that the other pattern is excluded in the initial patterning or the like.

In this case, drawing data is preliminarily generated, and this drawing data is used to perform the electron beam lithography. The drawing data contains data of a predetermined position at which a loop will be cut, which is designed to be narrower than a main pattern part. In this example, depending on whether the resist 12 is of positive type or negative type, the exposed portions of the pattern may be removed or stay. In this example, the exposed ("drawn") region (region irradiated with the electron beam) of the pattern is the portion of the resist film which is made to remain after development.

FIGS. 4A to 4H illustrate examples of drawing data. Drawing data 300 is used in drawing a pattern by an electron beam lithography apparatus and specifies a position to be drawn by the electron beam in a two-dimensional plane. In this example, a drawn region 320 to be drawn by an electron beam is a region in which a resist is made to remain during developing. An undrawn region 310 (that is a region not exposed by the electron beam beyond some threshold value) is removed during developing. This embodiment describes an example in which the drawn region 320 is a line pattern.

Figure 4A:
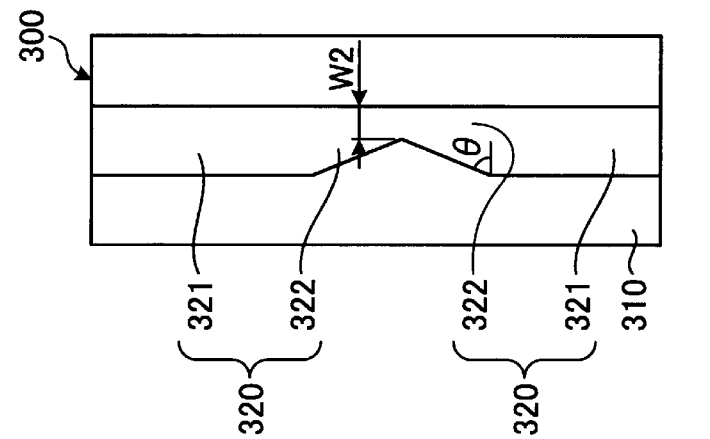

In drawing data in FIG. 4A, the drawn region 320 is laid out so that each end of the drawn regions 320 of the line pattern will have a modified pattern part 322. The modified pattern part 322 has a width that continuously decreases to be narrower than a main pattern part 321. An angle θ between a direction perpendicular to a side, which constitutes an outline in an extending direction of the main pattern part 321, and a side, which constitutes an outline of the modified pattern part 322, is desirably 60 degrees or less. In this example, two sides of the modified pattern part 322 are arranged relative to the two sides of the main pattern part 321 so as to form an angle θ against the direction perpendicular to the extending direction of the main pattern part 321. The modified pattern part 322 has an end with a width Wm, and the width Wm is desirably 70% or less of a width of the main pattern part 321.

While the modified pattern part 322 is provided at each end of the line pattern in this example, the modified pattern part 322 may be provided at any position of the line pattern. The modified pattern part 322 is provided at a position at which a loop is to be cut or a position at which the line pattern is to be sectioned/divided. The shape of the modified pattern part 322 is not limited to the shape illustrated in FIG. 4A and may be made in various shapes.

FIGS. 4B to 4H exemplify cases of providing the modified pattern part 322 at a position other than the end of the line pattern. In the case in FIG. 4B, the modified pattern part 322 has a narrowed end as in the case of the modified pattern part 322 illustrated in FIG. 4A.

Figure 4B:
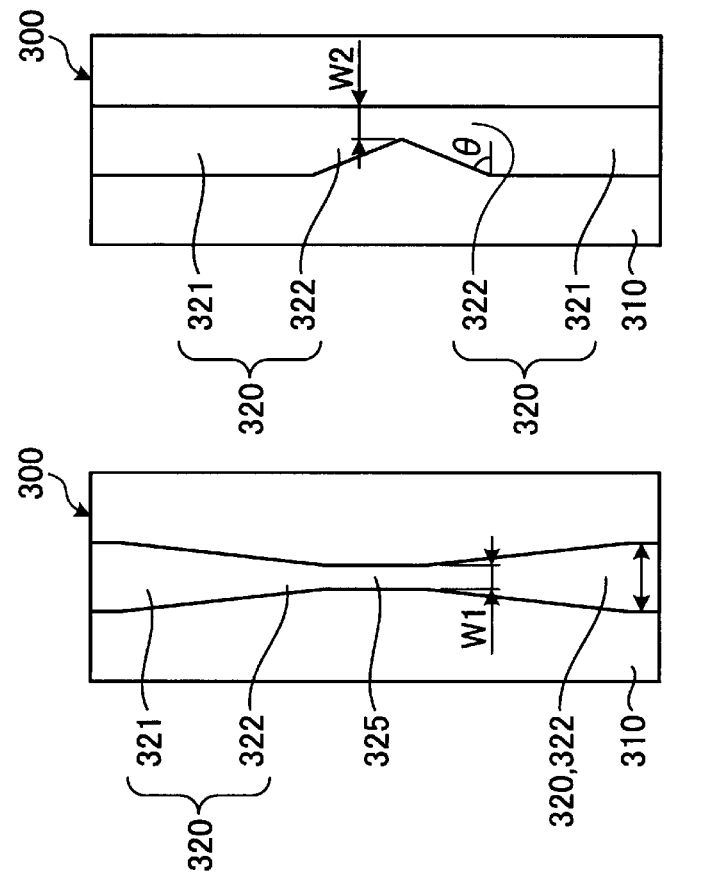
Figure 4C:
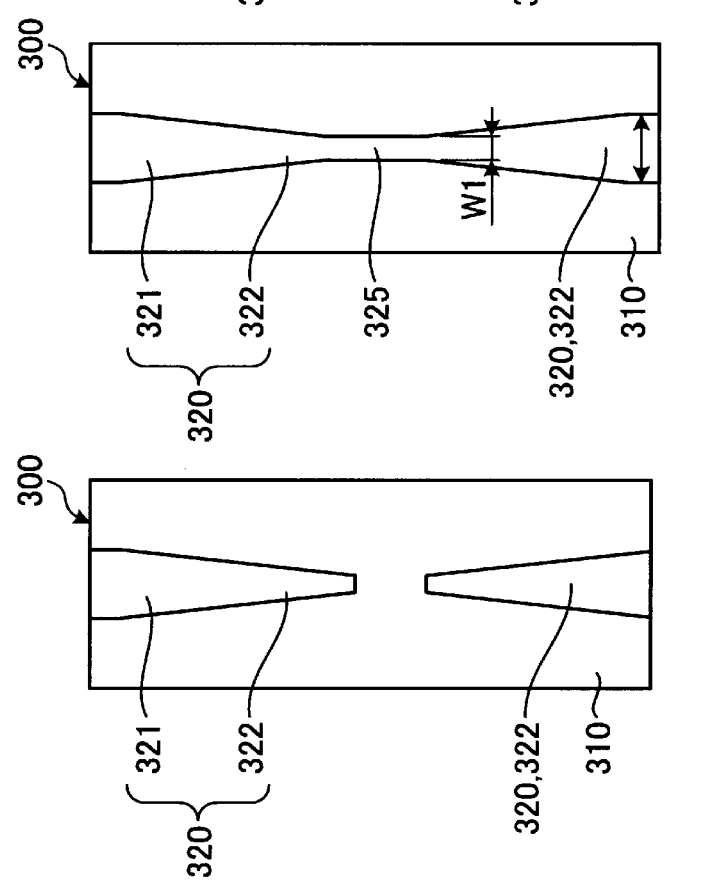

In the case illustrated in FIG. 4C, the drawn region 320 is laid out to make adjacent facing ends of the modified pattern parts 322 in FIG. 4B be connected by a connection 325. The connection 325 desirably has a width W1 that is 70% or less of the width of the main pattern part 321.

Figure 4D:
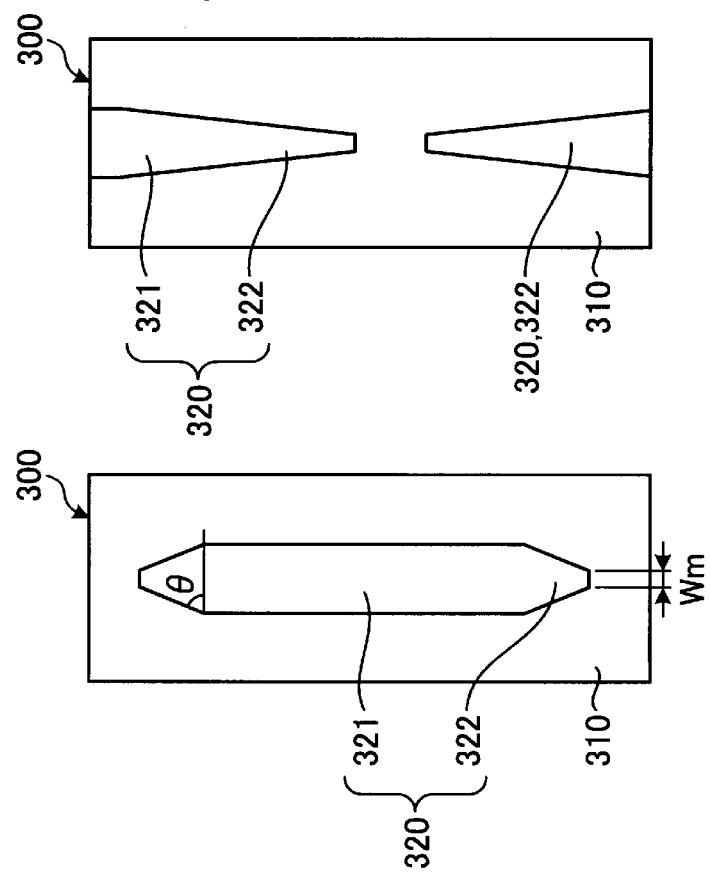

In the case illustrated in FIG. 4D, one side of the modified pattern part 322 is disposed to one of sides of the main pattern part 321, so as to have an angle θ relative to a direction perpendicular to an extending direction of the main pattern part 321. The other side of the modified pattern part 322 and the other side of the main pattern part 321 are made straight. Moreover, the adjacent facing ends of the modified pattern parts 322 are joined to each other. That is, the drawn region 320 is laid out to be recessed at one side in a region in which the modified pattern parts 322 are disposed in the linear drawn region 320. The modified pattern part 322 has an end with a width W2, and the width W2 is desirably 70% or less of the width of the main pattern part 321.

In the case illustrated in FIG. 4E, adjacent facing ends of the modified pattern parts 322 in the drawing data 300 in FIG. 4D are provided with the connection 325. This connection 325 desirably has a width W1 that is 70% or less of the width of the main pattern part 321.

FIG. 4F illustrates a case of forming the recess of the drawn region 320 by a curved line instead of a straight line in the drawing data 300 in FIG. 4D. In this case, the end of the modified pattern part 322 desirably has a width W2 that is 70% or less of the width of the main pattern part 321.

In the cases illustrated in FIGS. 4G and 4H, the drawn region 320 is laid out by dividing the linear drawn region 320, to generate two edges at the modified pattern part 322. The end of the modified pattern part 322 in FIG. 4G has a U-shaped curve. The end of the modified pattern part 322 in FIG. 4H has straight lines forming a V-shape, in the case in FIG. 4G. In these cases, a width of the edge is desirably 70% or less of the width of the main pattern part 321. A region that is irradiated with an electron beam is made to remain as a pattern in this embodiment. Alternatively, a region that is irradiated with an electron beam may be removed. In such cases, the drawn region 320 and the undrawn region 310 are switched with each other.

Figure 1B:
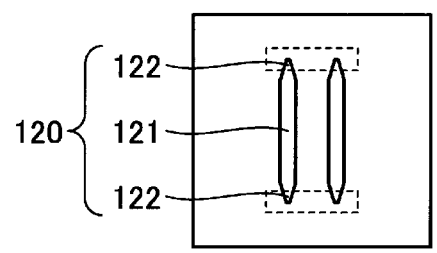
Figure 3B:
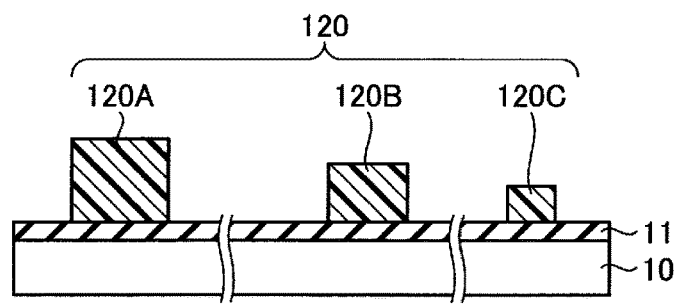

Next, as illustrated in FIGS. 1B and 3B, the resist 12 is developed. This results in removing the undrawn region 12b and leaving portions of the drawn region 12a on the hard mask film 11. In the developing process, an upper part of the resist 12 in the pattern/drawn portions narrower than the main pattern part 321 is subject to relatively more film thickness (height) reduction/erosion in the isotropic development process. This dissolution characteristic is used to obtain a resist core material of which height and dimensions are modified at a predetermined position after the developing is performed. In this first embodiment, a resist core material 120 having a main pattern part 121 and modified pattern parts 122 is formed. The main pattern part 121 has a side surface on which a sidewall spacer film will disposed on in a later step of the process. The modified pattern part 122 has a part on which a sidewall spacer film will not be disposed.

As illustrated in FIG. 2B, the formed resist core material 120 has a main pattern part 121 with a constant width and a constant height and each end of the main part 121 has part with decreasing width and height connected thereto. In the following descriptions, the resist core material 120 at the cross section CS-A in FIG. 2B is referred to as a resist core material 120A, the resist core material 120 at the cross section CS-B in FIG. 2B is referred to as a resist core material 120B, and the resist core material 120 at the cross section CS-C in FIG. 2B is referred to as a resist core material 120C.

Figure 5A:
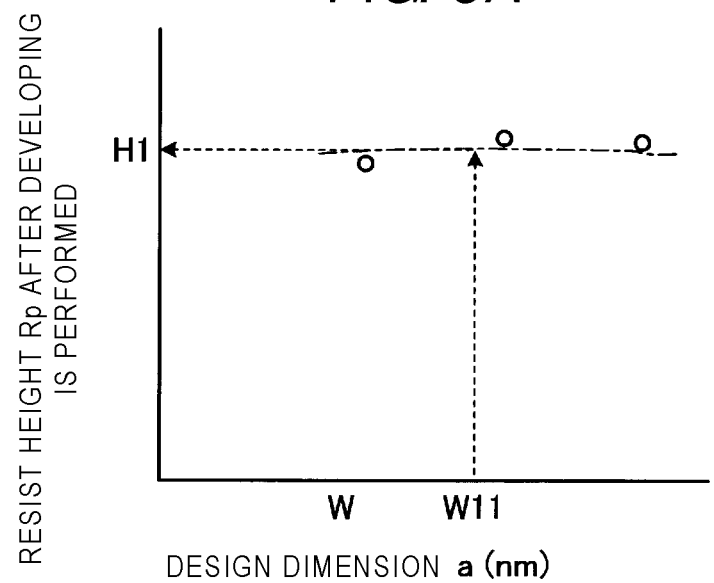
FIGS. 5A and 5B illustrate examples of a relationship of a height of a developed resist relative to a design dimension.
Figure 5B:
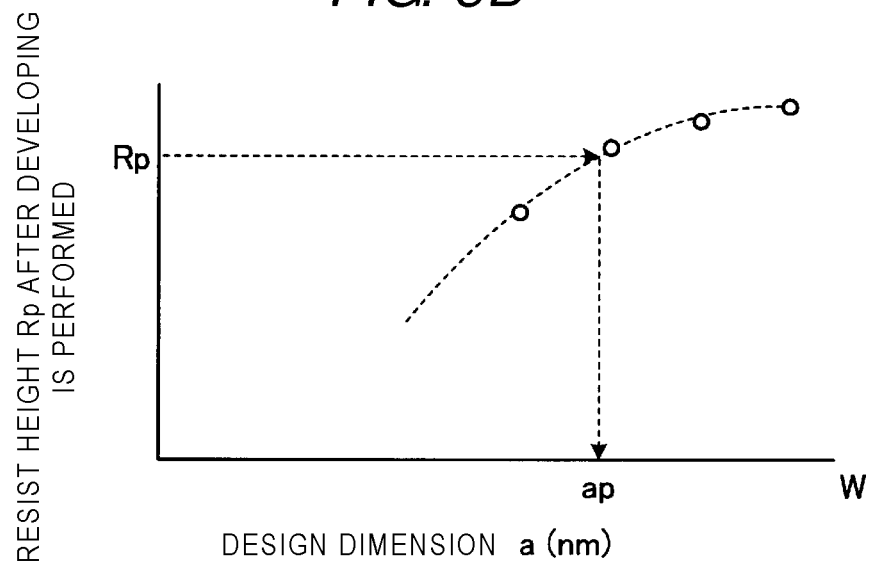

FIGS. 5A and 5B illustrate examples of a relationship of a height of a developed resist relative to a design dimension. FIG. 5A illustrates an example when the design dimension is a first value W or greater, and FIG. 5B illustrates an example when the design dimension is less than the first value W. The first value W is, for example, 30 nm. As illustrated in FIG. 5A, in a region of the resist pattern with a wide width having the first value W or greater as a design dimension, film reduction at an upper part of the resist 12 is approximately constant in developing, and the resist 12 will have an approximately constant height. On the other hand, as illustrated in FIG. 5B, when the design dimension of the resist pattern is less than the first value W, the film reduction at the upper part of the resist 12 in developing increases as the design dimension decreases, and thus, the height of the resist 12 is smaller after the developing has been performed. With reference to FIG. 5B, assuming that a resist height after developing, that is, a film thickness of the resist 12, is represented as Rp, and a design dimension of the main pattern part 121 is represented as "a", the resist height after developing is represented by a function that decreases with decreases in the design dimension. That is, when a pattern is drawn on the resist 12 by using the drawing data 300 for the modified pattern part 322 that has a width narrower than that of the main pattern part 321 as illustrated in FIGS. 4A to 4H, the height of the resist core material 120 having a narrower width is automatically reduced (in a self-aligned manner) by developing the resist 12.

Figure 1C:
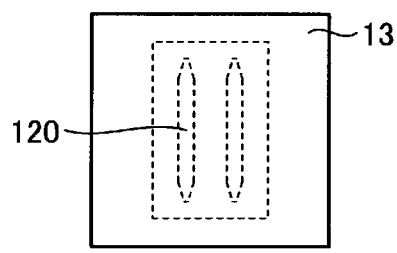
Figure 3C:
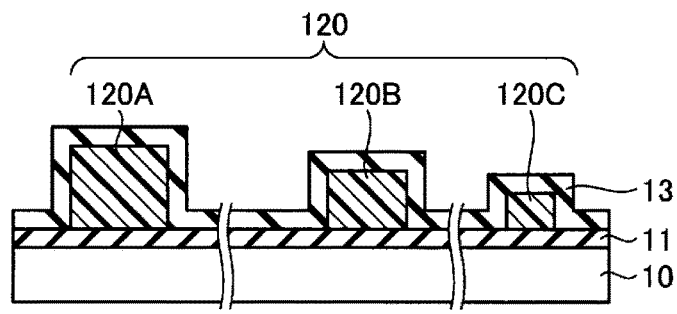

Thereafter, the resist core material 120 is used in the sidewall transferring process to form finer line patterns. As illustrated in FIGS. 1C and 3C, a sidewall spacer film 13 is formed on the hard mask film 11 on which the resist core material 120 is disposed. The sidewall spacer film 13 is, for example, an oxide film. The sidewall spacer film 13 is conformally formed on the resist core material 120. The thickness of the sidewall spacer film 13 is, for example, the width of a pattern to be formed on the template substrate 10.

Figure 1D:
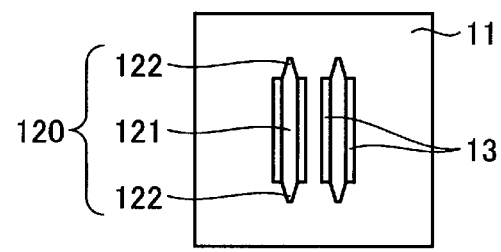
Figure 3D:
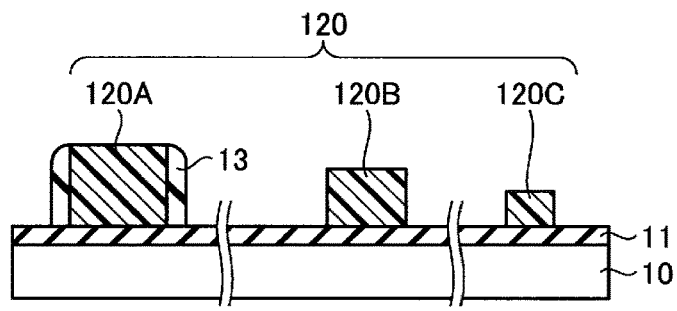

Next, as illustrated in FIGS. 1D and 3D, the sidewall spacer film 13 is etched back by anisotropic etching such as a reactive ion etching (RIE) method. At this time, the sidewall spacer film 13 on a top surface of the resist core material 120 and on the hard mask film 11 between the resist core materials 120 except for specific parts are etched back, and the sidewall spacer film 13 at a predetermined position of the resist core material 120 is also etched back. As a result, the sidewall spacer film 13 is removed at the predetermined position such as each end of the line pattern, thereby not forming a pattern having such a loop shape that the sidewall spacer film 13 surrounds the resist core material 120. Thus, this process can be called loop cutting. For example, as illustrated in FIG. 3D, the resist core material 120A at the cross section CS-A of the main pattern part 121 has an exposed top surface and side surfaces on which the sidewall spacer film 13 remains. The resist core materials 120B and 120C at the cross sections CS-B and CS-C of the modified pattern part 122 respectively have side surfaces and a top surface from which the sidewall spacer film 13 is removed. That is, the sidewall spacer film 13 only remains on the side surfaces of the main pattern part 121.

Figure 1E:
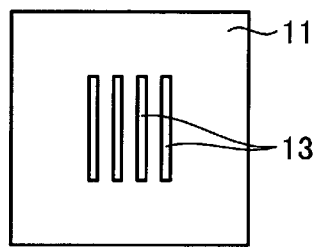
Figure 3E:
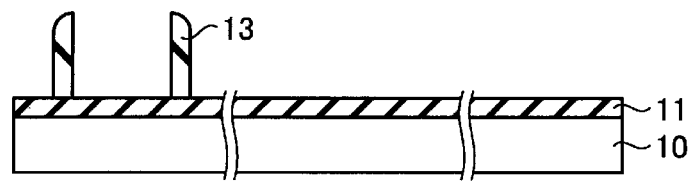

Then, as illustrated in FIGS. 1E and 3E, the resist core material 120 is removed by a resist stripping technique. This results in a condition in which the multiple line patterns of the sidewall spacer films 13 are arranged in parallel on the hard mask film 11. In the region in which the modified pattern part 122 is formed, the sidewall spacer film 13 is already removed, and thus, nothing exists on the hard mask film 11 at each of the cross sections CS-B and CS-C as illustrated in FIG. 3E.

Figure 1F:
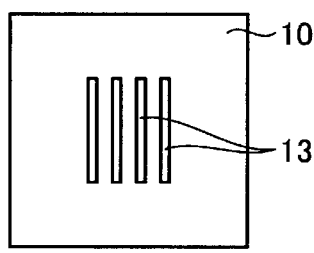
Figure 1G:
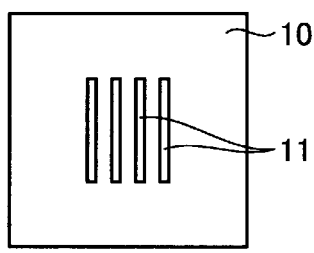
Figure 1H:
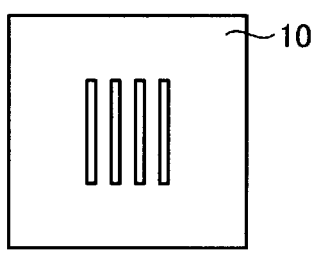
Figure 3F:
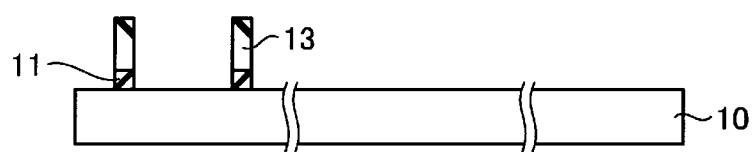
Figure 3G:
Figure 3H:
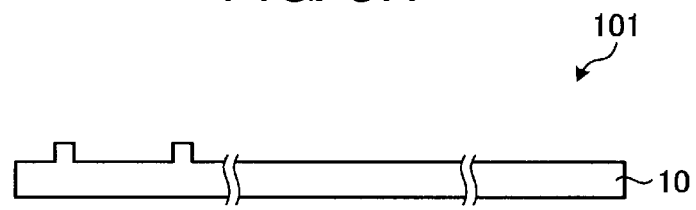

Next, as illustrated in FIGS. 1F and 3F, the hard mask film 11 is next processed by anisotropic etching such as an RIE method, using the sidewall spacer film 13 as an etch mask. This causes the shape of the sidewall spacer film 13 to be transferred into the hard mask film 11. Further, as illustrated in FIGS. 1G and 3G, the template substrate 10 is processed by anisotropic etching such as an RIE method, using the obtained pattern of the hard mask film 11 as an etch mask. The template substrate 10 is etched to a predetermined depth. As a result, a recess is formed on the template substrate 10. Thereafter, as illustrated in FIGS. 1H and 3H, the hard mask film 11 is removed to obtain a master template 101. The master template 101 is to be used in making a replica template, that is as a mold for making the replica template.

Figure 6A:
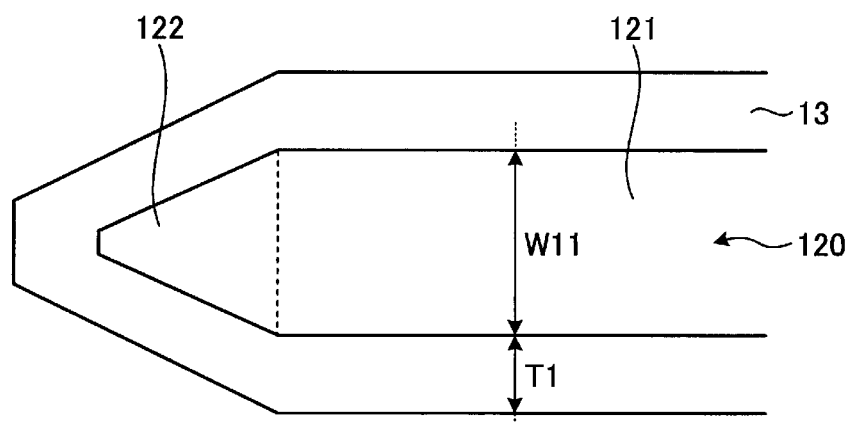
FIGS. 6A and 6B illustrate an example of relationships of dimensions between a resist pattern having a modified pattern part and a sidewall spacer film according to the first embodiment.
Figure 6B:
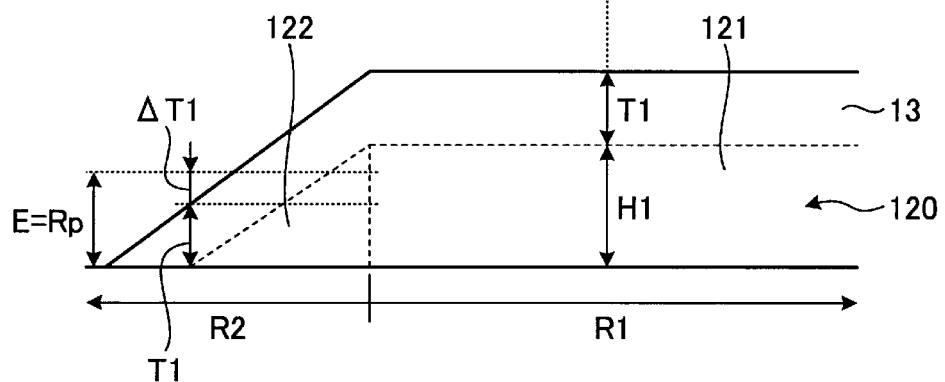

The width and height of the resist core material 120, which has a modified height, in FIGS. 1B, 2A, 2B, and 3B, are described below. FIGS. 6A and 6B illustrate an example of relationships of dimensions between a resist pattern having a modified pattern part and a sidewall spacer film according to the first embodiment. FIG. 6A is a top view, and FIG. 6B is a side view. It is assumed that the width of the main pattern part 121 is represented as W11, and the width of the modified pattern part 122 continuously decreases from the width W11. The design dimension of the width W11 of the main pattern part 121 is 20 nm or greater, which is a limit of resolution performance of electron beam resist.

As illustrated in FIG. 5A, the main pattern part 121 with the width W11 has a resist height H1 after the resist is developed. As illustrated in FIG. 5B, the modified pattern part 122 (with a width narrower than the width W11) has a height less than the resist height H1 after the resist is developed.

The sidewall spacer film 13 is conformally formed on the resist core material 120 so it has a thickness T1 on the side surface of the main pattern part 121. At this time, the sidewall spacer film 13 with the thickness T1 is also formed on the top surface of the main pattern part 121.

The sidewall transferring process involves etching back to cause the sidewall spacer film 13 formed on the top surface of the resist core material 120 to be completely removed. In the first embodiment, while the etching back is performed, the sidewall spacer film 13 that is formed on the side surface of the modified pattern part 122 is also removed. Assuming that an amount of over etching of the sidewall spacer film 13 during etching back is represented as ΔT1 [%], a thickness E of the sidewall spacer film 13 to be removed by the etching back is represented by the following formula (1):

$$E = T1 \times (100 + \Delta T1)/100 \tag{1}$$

The sidewall spacer film 13 at the side surface of the resist core material 120 is made to remain in a region having a resist core material 120 with a thickness greater than the thickness E of the sidewall spacer film 13. The sidewall spacer film 13 at the side surface of the resist core material 120 is removed in a region having a resist core material 120 with a thickness less than the thickness E of the sidewall spacer film 13. Thus, a position having a resist height Rp that has the same value as the thickness E represented by the formula (1) is a boundary between a region in which the sidewall spacer film 13 is made to remain and a region in which the sidewall spacer film is removed. That is, the modified pattern part 122 includes a region in which the resist height Rp satisfies the following relationship (2):

$$Rp < T1 \times (100 + \Delta T1)/100 \tag{2}$$

The design dimension of the resist pattern for obtaining the resist height Rp is obtained from the graph in FIG. 5B. Thus, a design dimension "ap" of the resist pattern for obtaining a resist height satisfying the relationship (2) is less than the design dimension of the width W11 of the main pattern part 121. The drawing data, as illustrated in FIGS. 4A to 4H, is generated for obtaining this design dimension "ap".

In the first embodiment, electron beam lithography is performed on the resist 12 that is applied onto the template substrate 10 to make the modified pattern part 122, which has a width narrower than that of the main pattern part 121, in a region that will have a loop to be cut. Developing the resist 12 also reduces the resist height in the region in which the width is narrow. The sidewall spacer film 13 is formed over the template substrate 10 on which the developed resist core material 120 is formed, and the formed sidewall spacer film 13 is etched back. The modified pattern part 122 is made to include the region in which the resist height Rp satisfies the relationship (2), assuming that the thickness of the sidewall spacer film 13 is represented as T1, and an amount of over etching during etching back is represented as ΔT1 [%].

Thus, the sidewall spacer film 13 that is formed on the side surface of the modified pattern part 122 of the resist core material 120 satisfying the relationship (2) is removed during etching back. As a result, whereas a sidewall spacer film 13 with a loop shape would be formed around the resist core material 120 in an ordinary method, a sidewall spacer film 13 with a line-and-space shape is instead formed with the sidewall spacer film 13 by the method of the first embodiment. That is, another process for cutting a loop is not necessary to change a sidewall spacer film 13 having a loop shape into a line-and-space pattern. This enables reduction in manufacturing costs of a template and a semiconductor apparatus that is manufactured by using the template.

Second Embodiment

Figure 7A:
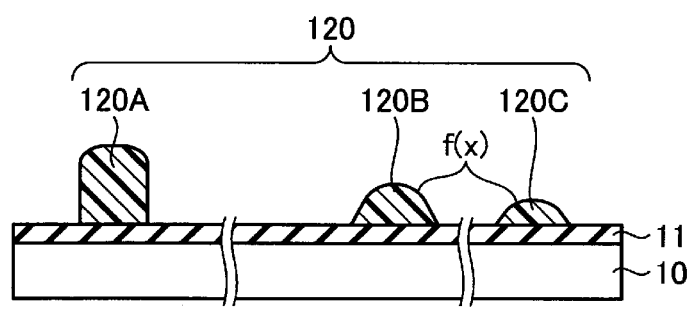
FIGS. 7A to 7C are cross-sectional views schematically illustrating a procedure of a pattern forming method according to a second embodiment.
Figure 7B:
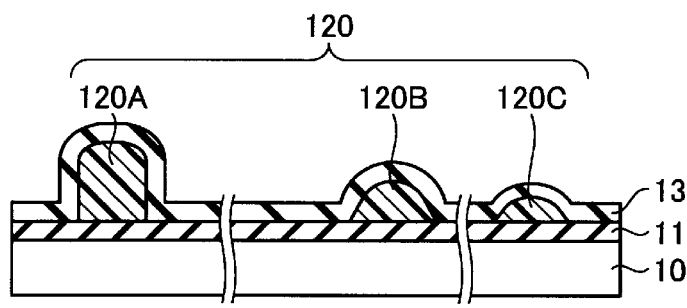
Figure 7C:
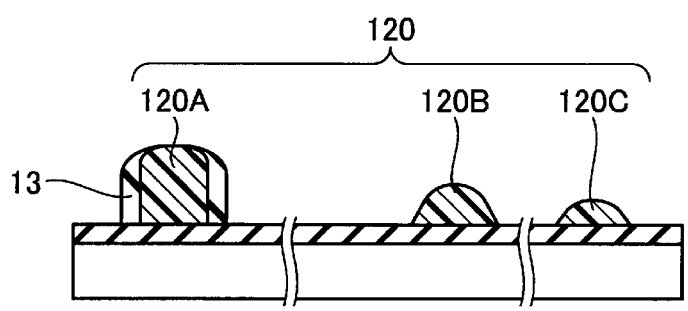

FIGS. 7A to 7C are cross-sectional views schematically illustrating an example of a procedure of a pattern forming method according to a second embodiment. FIGS. 7A to 7C illustrate the cross section CS-A, the cross section CS-B, and the cross section CS-C of the resist core material 120 illustrated in FIG. 2B, as in the case of FIGS. 3A to 3H.

Similar to the case in FIGS. 1A, 1B, 3A, and 3B, in the first embodiment, a pattern is drawn by electron beam lithography on the template substrate 10 on which a resist 12 is applied via the hard mask film 11. The e-beam patterned resist 12 is developed to form the resist core material 120. Thereafter, as illustrated in FIG. 7A, the resist core material 120 is etched back by anisotropic etching such as an RIE method. This makes the resist core material 120 have a rounded shape. The resist core material 120A of the main pattern part 121 is composed of a rounded upper part and side walls that are approximately perpendicular to a surface of the substrate. The resist core materials 120B and 120C of the modified pattern part 122 are rounded over their entire height direction (there is a lack of approximately perpendicular sidewalls on the resist core materials 120B and 120C).

The etching back is performed so that the resist core material 120 will have a cross sectional shape, which is represented by a differentiable function f(x), in a plane perpendicular to the extending direction of the resist core material 120 of the modified pattern part 122. The cross sectional shape of the resist core material 120 is controlled by changing conditions of the etching back process. In the second embodiment, the etching back process is performed under an etching back condition that causes an angle to be between 0 degrees and 65 degrees in every cross section of the resist core material 120 of the modified pattern part 122. The angle is formed between a tangent line of a curve f(x) and a top surface of the template substrate 10. The curve f(x) represents a contour of a cross section of the resist core material 122 of the modified pattern part 122.

Then, as illustrated in FIG. 7B, a sidewall spacer film 13 is formed on the hard mask film 11 on which the resist core material 120 is disposed. The sidewall spacer film 13 is conformally formed on the resist core material 120. The thickness of the sidewall spacer film 13 is, for example, the width of a pattern to be formed on the template substrate 10.

Next, as illustrated in FIG. 7C, the sidewall spacer film 13 is etched back by anisotropic etching such as an RIE method. Similar to the case of the first embodiment, the sidewall spacer film 13 on the top surface of the resist core material 120 and on the hard mask film 11 between the resist core materials 120 excepting for specific parts are etched back, and the sidewall spacer film 13 at the predetermined position of the resist core material 120, that is, at the modified pattern part 122, is also etched back. As a result, the sidewall spacer film 13 is cut at the predetermined position, such as each end of the line pattern, thereby a loop pattern is not formed by the sidewall spacer film 13. Thus, the sidewall spacer film 13 only remains on the side surfaces of the main pattern part 121 of the resist core material 120.

In general, a sputtering yield varies depending on an incident angle of sputter particles relative to a surface of an object to be processed, and the sputtering yield is normally at the maximum when the sputtering incident angle is 45 to 60 degrees. That is, the sputtering yield tends to be great when the incident angle is 45 to 60 degrees rather than 90 degrees. In consideration of this, in the second embodiment, the modified pattern part 122 is made to contain a part that satisfies an inequality: $Y(\theta(x)) \geq Y(90°)$, in which the symbol $\theta(x)$ represents an angle between a tangent line of a curve f(x) and a top surface of the template substrate 10, and the symbol $Y(\theta(x))$ represents a sputtering yield of the resist core material 120. The curve f(x) represents a contour of a cross section of the resist core material 120 of the modified pattern part 122.

For example, in the case in FIG. 7A, the contour is made so that an angle between a tangent line of a curve f(x) and the top surface of the template substrate 10 will between 0 degrees and 65 degrees. The curve f(x) represents a contour of a cross section of the resist core material 120B or 120C of the modified pattern part 122. Thus, sputter particles enter each position of the modified pattern part 122 approximately at an incident angle that makes the sputtering yield maximum, instead of 90 degrees. On the other hand, as in the case of the modified pattern part 122, sputter particles enter each position of the top surface of the main pattern part 121 at an incident angle except for 90 degrees due to the roundish top surface. However, the side surface is perpendicular to the surface of the template substrate 10 and is thereby scarcely etched. This structure generates conditions having different sputtering yields between the main pattern part 121 and the modified pattern part 122. That is, this structure generates a condition that facilitates sputtering of the modified pattern part 122 more than the main pattern part 121. Thus, the sidewall spacer film 13 that is formed on each of the top surface and the side surfaces of the modified pattern part 122 can be removed while primarily only the sidewall spacer film 13 on the top surface of the main pattern part 121 is removed. Thereafter, processes similar to the processes described in FIGS. 1E to 1H and FIGS. 3E to 3H in the first embodiment are performed.

In this second embodiment, the resist core material 120 is rounded in the etching back by anisotropic etching after the resist core material 120 has been developed. However, this second embodiment is not limited to this method. For example, the resist core material 120 may be heated at a temperature exceeding its glass transition temperature (Tg), the patterned resist core material 120 may be irradiated with an energy beam (such as an electron beam), or the resist core material 120 may be wet treated with chemical solution that dissolves the resist core material 120. In the case of the energy beam, in some examples, only the modified pattern part 122 may be irradiated with the energy beam. In the case of performing the wet treatment, a hydrophilic treatment may be performed on the resist core material 120 at a desired position such as at the modified pattern part 122, and chemical solution such as solution of sulfuric acid ($H_2SO_4$) and hydrogen peroxide ($H_2O_2$) may be used to round the resist core material 120.

The second embodiment also provides effects similar to those obtained by the first embodiment.

Third Embodiment

The above describes a pattern forming method for cutting a loop that is generated in manufacturing of a master template using the sidewall transferring process without performing a loop cutting process on the master template. However, a loop that is generated on a replica template may also be cut without using a loop cutting process instead of a loop on the master template used to form the replica template.

Figure 8A:
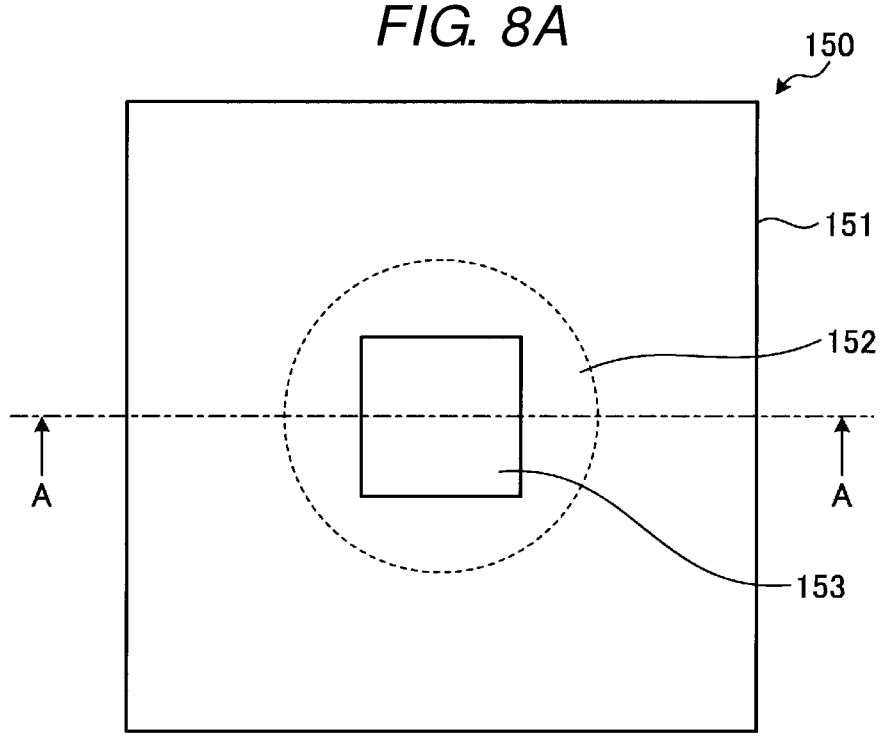
FIGS. 8A and 8B illustrate a structure of a master template according to a third embodiment.
Figure 8B:
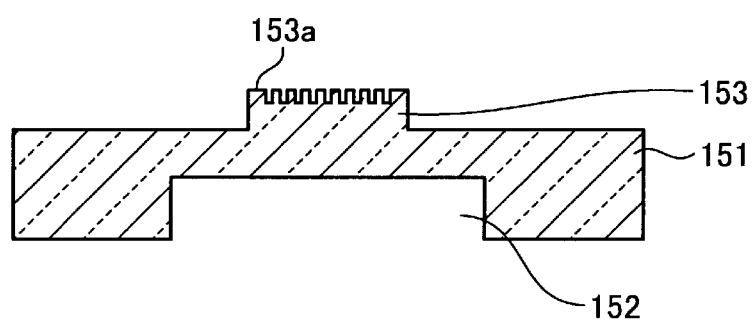
Figure 9A:
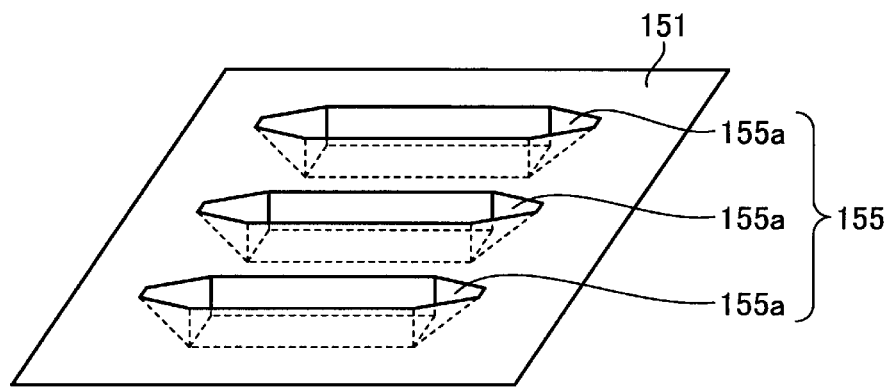
FIGS. 9A to 9C illustrate an example of a recess pattern of a master template according to a third embodiment.
Figure 9B:
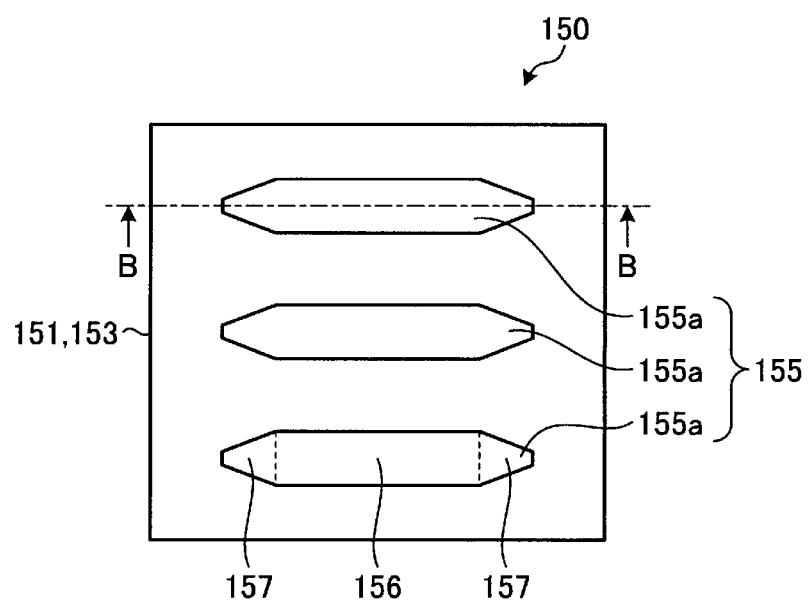
Figure 9C:
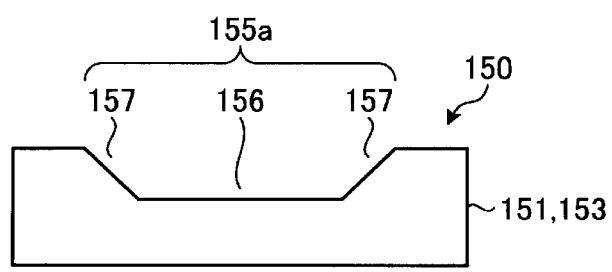

FIGS. 8A and 8B illustrate an example of a structure of a master template according to a third embodiment. FIG. 8A is a top view, and FIG. 8B is a cross-sectional view taken along an A-A line in FIG. 8A. FIGS. 9A to 9C illustrate an example of a recess pattern of the master template according to the third embodiment. FIG. 9A is an oblique view, FIG. 9B is a top view, and FIG. 9C is a cross-sectional view taken along a B-B line in FIG. 9B.

FIGS. 8A and 8B illustrate a master template 150 that includes a rectangular template substrate 151 and a base 153 provided approximately at the center of one of surfaces of the template substrate 151.

The template substrate 151 has, for example, a rectangular plate shape. The template substrate 151 is made primarily of quartz glass.

The base 153 has a plateau shape that projects from the surrounding parts. The base 153 has a rectangular shape in a plane view. The base 153 has a pattern formation surface 153*a* on which a projection-and-recess pattern is provided. The projection-and-recess pattern is ultimately to be brought into contact with an imprint resist on an object to be printed in an imprinting process.

The template substrate 151 has a hollow 152 on a backside surface opposite of the side with the base 153 thereon. The hollow 152 has a circular shape in a plane view.

As illustrated in FIGS. 9A to 9C, a recess pattern 155 is formed in the pattern formation surface 153*a* of the master template 150. The recess pattern 155 is used for patterning a resist core material when a pattern is to be formed on a replica template by using the sidewall transferring process. The recess pattern 155 has, for example, multiple linear recesses 155*a* that are arranged in parallel, corresponding to a line-space pattern. Each linear recess 155*a* has a main pattern part 156 and modified pattern parts 157. The modified pattern part 157 has width and depth that decrease from a part in contact with the main pattern part 156. The width of the modified pattern part 157 is set so that the modified pattern part 157 will be completely filled with a resist in an imprinting process. This structure allows formation of the resist core material 120 having a shape as illustrated in FIGS. 2A and 2B in the first embodiment when the master template 150 is pressed upon a replica template substrate via an imprint resist, and the imprint resist is then solidified.

In the third embodiment, the master template 150 includes the linear recess 155*a* that has the main pattern part 156 and the modified pattern parts 157, each of which the width and the depth decrease from the part in contact with the main pattern part 156. This enables forming a resist core material 120 that requires no loop cutting process when the final pattern is formed on the replica template substrate using a sidewall transferring process.

In the above embodiments, for example, FIGS. 2A and 2B illustrate an example in which the width and the height of the modified pattern part 122 continuously decrease from the main pattern part 121. However, the disclosure is not limited to this structure. In one example, the modified pattern part 122 may have a width and a height that stepwisely decrease from the main pattern part 121.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A pattern forming method, comprising:
   forming a line pattern with a first film on a substrate, the line pattern including a first pattern part including feature portions at a first dimension and a second pattern part adjacent to the first pattern part and including feature portions at a second dimension smaller than the first dimension of the first pattern part;
   forming a second film on the substrate conformally over the first film;
   etching the second film to expose a top surface of the first pattern part of the first film and remove the second pattern part of the first film;
   removing the first film and leaving portions of the second film formed on sidewalls of the first pattern part; and
   processing the substrate by using the portions of the second film left after the removing of the first film as a mask, wherein
   the second pattern part is in an end region of the line pattern.

2. The pattern forming method according to claim 1, further comprising:
   rounding an upper surface of the second pattern part before the second film is formed on the substrate.

3. The pattern forming method according to claim 1, further comprising:
   etching the first film to round upper surfaces of the line pattern before forming the second film on the substrate.

4. The pattern forming method according to claim 1, further comprising:
   exposing at least a portion of the first film to a chemical solution before forming the second film.

5. The pattern forming method according to claim 1, further comprising:
   after forming the line pattern, heating the substrate to a temperature that exceeds a glass transition temperature of the first film before forming the second film.

6. The pattern forming method according claim 1, further comprising:
   exposing the line pattern formed on the substrate to an electron beam before forming the second film.

7. The pattern forming method according to claim 1, wherein the first film is a negative tone electron beam resist material and the line pattern is formed using electron beam lithography.

8. The pattern forming method according to claim 1, wherein the line pattern is formed using electron beam lithography.

9. The pattern forming method according to claim 1, wherein the line pattern is formed using imprint lithography.

10. The pattern forming method according to claim 1, wherein the second pattern part has a height less than a height of the first pattern part.

11. The pattern forming method according to claim 10, wherein the second pattern part has a width that continuously decreases from a width of the first pattern part.

12. A method of manufacturing a template for imprint lithography, comprising:
patterning an electron beam resist on a template substrate using electron beam lithography to form a line pattern having a first pattern part and a second pattern part adjacent to the first pattern part, the second pattern part having a width less than a width of the first pattern part;
developing the electron beam resist to form a resist pattern on the template substrate corresponding to the line pattern having the first pattern part and the second pattern part;
performing a pattern doubling process on the resist pattern using a conformal film deposited on the resist pattern and an etching process to remove portions of the conformal film and the second pattern part of the resist pattern at the same time; and
etching into the template substrate using remaining portions of the conformal film as an etch mask after the performing of the pattern doubling process.

13. The method according to claim 12, wherein the features of the second pattern part have a width that continuously decreases from a width of the features of the first pattern part.

14. The method according to claim 12, wherein the second pattern part is in an end region of the line pattern.

15. The method according to claim 12, further comprising:
processing the template substrate with the resist pattern formed thereon to round an upper surface of the resist pattern before performing the pattern doubling process.

16. The method according to claim 15, wherein the processing of the template substrate comprises at least one exposing the template substrate to a chemical solution or heating the template substrate.

17. A method for imprint lithography, comprising:
patterning an electron beam resist on a first template substrate using electron beam lithography to form a line pattern having a first pattern part and a second pattern part adjacent to the first pattern part, the second pattern part having features with a width less than a width of features in the first pattern part;
developing the electron beam resist to form a resist pattern on the first template substrate corresponding to the line pattern;
etching into the first template substrate using the resist pattern as an etch mask;
forming an imprint pattern on a substrate by using the first template substrate in an imprint lithography process, the imprint pattern corresponding to the line pattern formed on the first template substrate;
performing a pattern doubling process on the imprint pattern formed on the substrate by using a conformal film and an etching process to remove portions of the conformal film and portions of the imprint pattern corresponding to the second pattern part; and
etching into the substrate using remaining portions of the conformal film as an etch mask after the performing of the pattern doubling process.

18. The method of claim 17, wherein the first template substrate is a master template substrate and the substrate is a daughter template substrate.

* * * * *